United States Patent [19]

Yamazaki

[11] Patent Number: 5,355,109
[45] Date of Patent: Oct. 11, 1994

[54] ELECTRIC NOISE ABSORBER

[75] Inventor: Yasuo Yamazaki, Tougane, Japan

[73] Assignee: Kitagawa Industries Co., Ltd., Japan

[21] Appl. No.: 12,540

[22] Filed: Feb. 2, 1993

[30] Foreign Application Priority Data

Feb. 3, 1992 [JP] Japan .................... 4-003501[U]

[51] Int. Cl.⁵ .................... H01F 17/06; H01F 27/02; H01F 27/26
[52] U.S. Cl. .................... 336/92; 174/65 R; 174/92; 333/12; 336/175; 336/176
[58] Field of Search ............... 174/92, 153 G, 152 G, 174/65 R; 324/127; 333/81 R, 182, 183, 12; 336/175, 176, 174, 212, 92

[56] References Cited

U.S. PATENT DOCUMENTS

| | | | |
|---|---|---|---|
| 3,519,731 | 7/1970 | Grunbaum | 174/92 |
| 4,825,185 | 4/1989 | Matsui | 336/175 |
| 4,885,559 | 12/1989 | Nakano | 336/175 |
| 4,972,167 | 11/1990 | Fujioka | 336/92 |

FOREIGN PATENT DOCUMENTS

| | | |
|---|---|---|
| 63-165815 | 10/1988 | Japan . |
| 2127236 | 4/1984 | United Kingdom . |
| 2224394 | 5/1990 | United Kingdom . |
| 2241834 | 9/1991 | United Kingdom . |

*Primary Examiner*—Thomas J. Kozma
*Attorney, Agent, or Firm*—Davis, Bujold & Streck

[57] ABSTRACT

A noise absorber that can be securely attached around electric wires of various diameters and types, and can be firmly closed without any electric wire caught between the ferrite parts. Wire supports are erected at both sides of a wire-receiving through hole on the inner surfaces of opposed walls of a first case member of the noise absorber. The tips of the wire supports are tilted toward the central axis of the through hole. Almost Y-shaped receptors are formed on the inner surfaces of opposed walls of the second case member for engaging with the tips of the wire supports when the case members are closed. The upper portions of the receptors serve as guide slopes for pressing inwardly the tips of the wire supports, so that the wires are securely pinched between the wire supports.

13 Claims, 12 Drawing Sheets

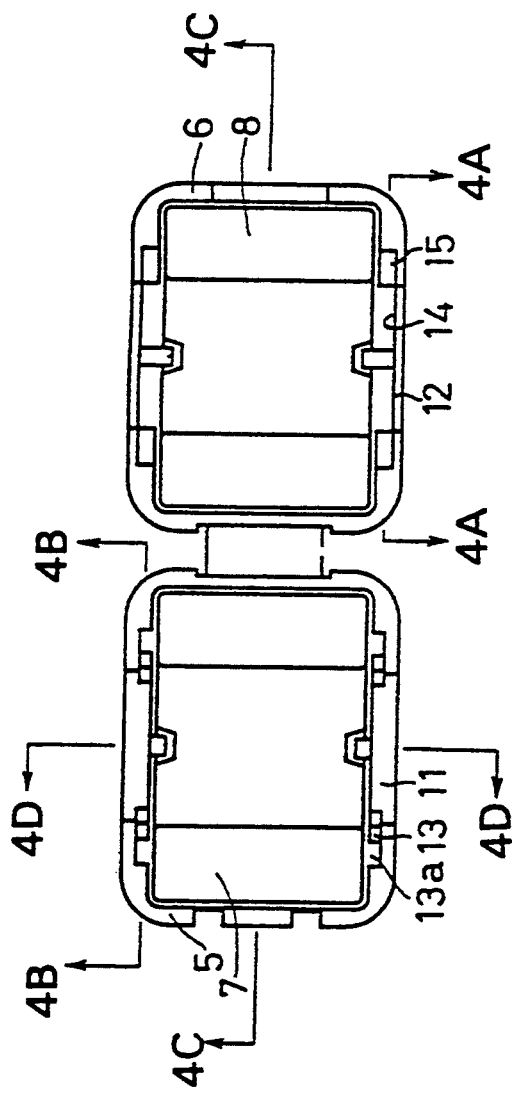
FIG. 2A
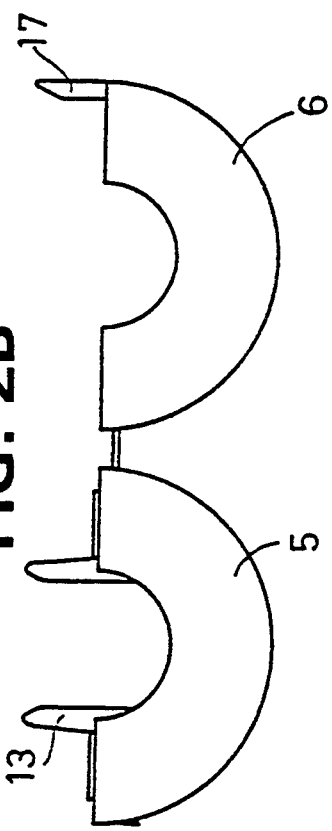
FIG. 2B
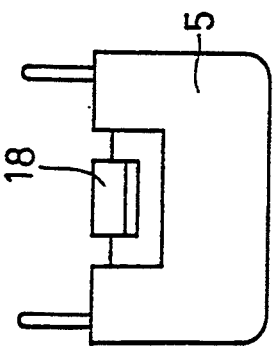
FIG. 2D
FIG. 2C

ELECTRIC NOISE ABSORBER

BACKGROUND OF THE INVENTION

This invention relates to an electric noise absorber and, in particular, to an electric noise absorber attached to an electric antenna wire of an electronic device for absorbing electric noise which is irradiated from the wire or which enters the device through the wire from the outside.

As a known noise absorber, magnetic ferrite is attached around the wire for absorbing noise current flowing in the wire.

Such a noise absorber is proposed in Japanese Laid-open Utility Model Application No. 63-165815. This noise absorber is composed of a tubular ferrite body and a plastic case for housing the ferrite body. Two axially separated parts of the ferrite body are respectively housed in two hingedly connected members composing the plastic case, and are then attached around an electric cable. The noise absorber is thus attached substantially midway on the extending cable.

In the prior-art noise absorber, however, since just deformable projections extending from the periphery of the case define a through hole in the plastic case to hold the case on the electric cable when the case is closed, the noise absorber cannot be securely held around in place on the electric cable. The noise absorber is therefore easily dislocated from its originally attached position particularly when the noise absorber is attached around a bundle of many small-diameter wires. Also, the electric cable is sometimes caught between the ferrite body parts when the case members are hingedly closed, thereby hampering the case members from being completely closed.

SUMMARY OF THE INVENTION

An object of the invention is to provide a noise absorber that can be securely attached around different electric wires varying in diameter and type.

Another object of the invention is to provide a noise absorber that can be completely closed without catching any electric wires between the ferrite members.

These and other objects are attained by a noise absorber according to the invention. The noise absorber comprises a pair of magnetic bodies for surrounding the outer periphery of an electric wire or a bundle of many small-diameter wires and an openable and closable holding case. The holding case is provided with first and second hingedly connected case members for respectively housing the magnetic bodies. In order to absorb noise current flowing through the electric wire the electric noise absorber is securely attached around the electric wire. The case is formed such that a through hole is formed in the holding case by closing the holding case with the magnetic bodies mounted therein for holding the electric wire. A wire support member protrudes from the upper edge of the first case member. The edge abuts the opposed edge of the second case member when the case members are joined together. An indented portion is formed in the second case member for receiving the wire support member when the case is closed by joining the two case members. The wire support member prevents the electric wire from moving toward the upper edge of the first case member and from being caught between the abutment surfaces of the magnetic bodies. Consequently, the case members can be easily closed. Further, the noise absorber can be easily attached to or detached from the electric wire.

Two pairs of resilient wire-support members can be erected respectively from the sides of the half through hole provided in the first case member. Alternatively, wire-support members are formed on each wall of the case member, such that the wire-support member erected from one side of the half through hole is arranged diagonally in relation to the wire-support member erected from the other side.

In operation, the electric wire is first inserted into the through hole in one of the case members and then the case members with the magnetic bodies housed therein are closed. The tips of the resilient wire-support members erected from the first case member are bent toward the central axis of the through hole by the pressure guide portions in the second case member. Therefore, the electric wire in the through hole is securely held by the resilient wire-support members, and the noise absorber is securely attached around the electric wire.

BRIEF DESCRIPTION OF THE DRAWINGS

FIGS. 2A, 2B, 2C and 2D are a plan view, a front view, a left side view, and a right side view, respectively, of a holding case according to the first embodiment;

DETAILED DESCRIPTION OF THE PREFERRED EMBODIMENT

Figure 1:
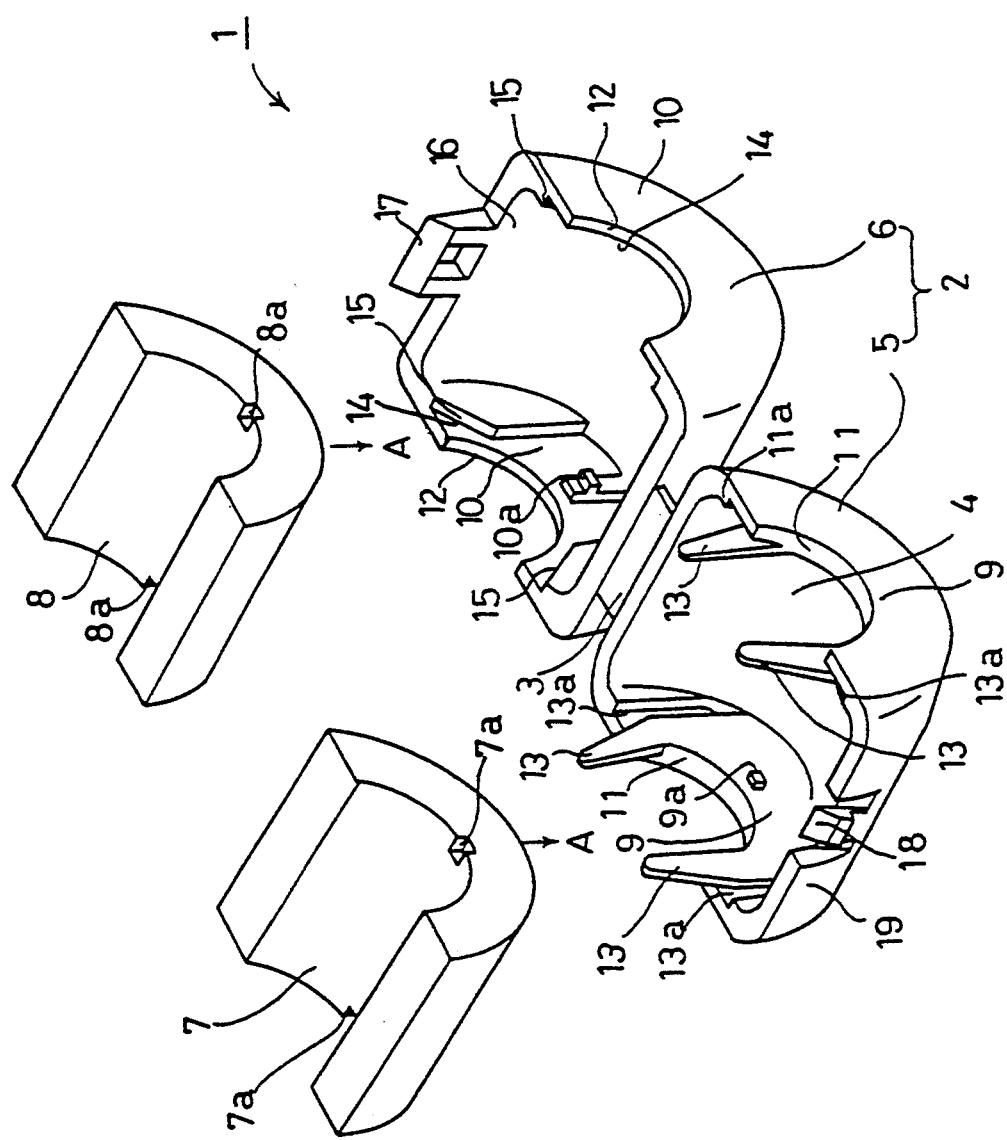
FIG. 1 is an exploded view of the noise absorber of a first embodiment according to the invention.
Figure 3A:
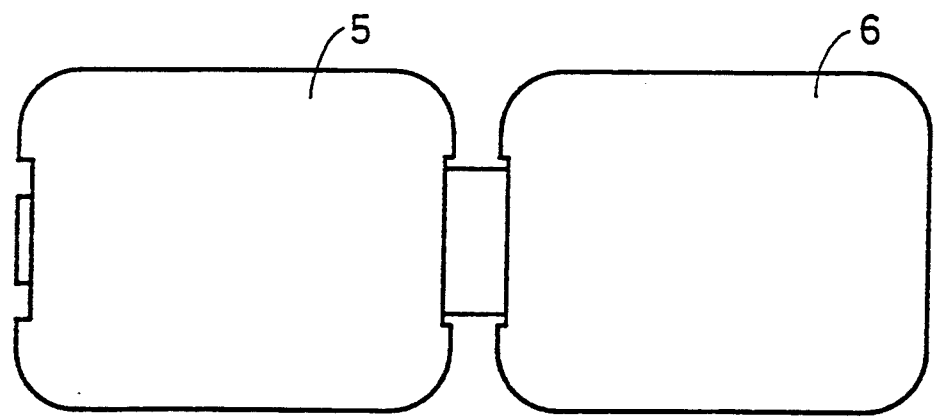
FIGS. 3A and 3B are a bottom view and a rear view, respectively, of the holding case according to the first embodiment.
Figure 3B:
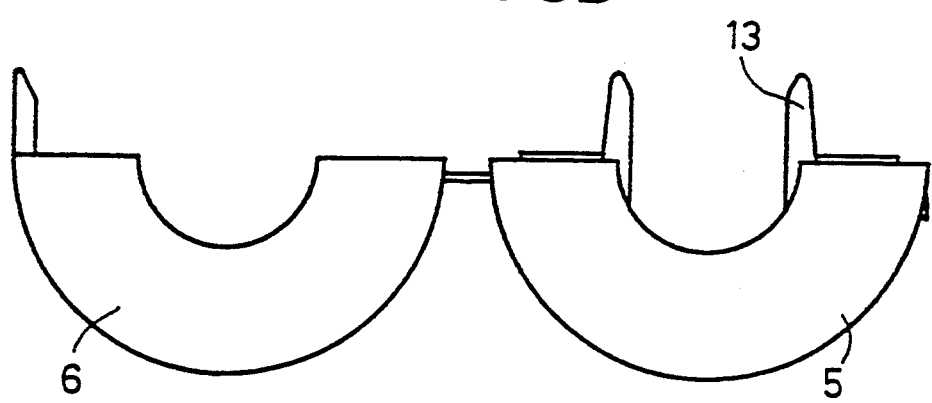
Figure 4A:
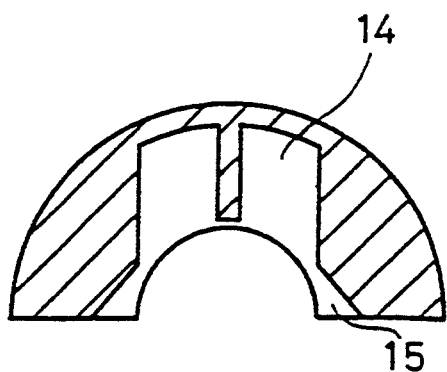
FIGS. 4A, 4B, 4C and 4D are cross-sectional views taken along lines 4A—4A, 4B—4B, 4C—4C, and 4D—4D, respectively, of FIG. 2A.
Figure 4B:
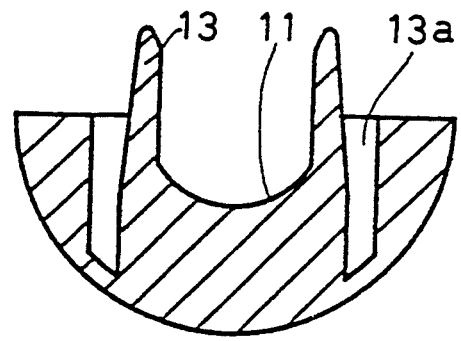
Figure 4C:
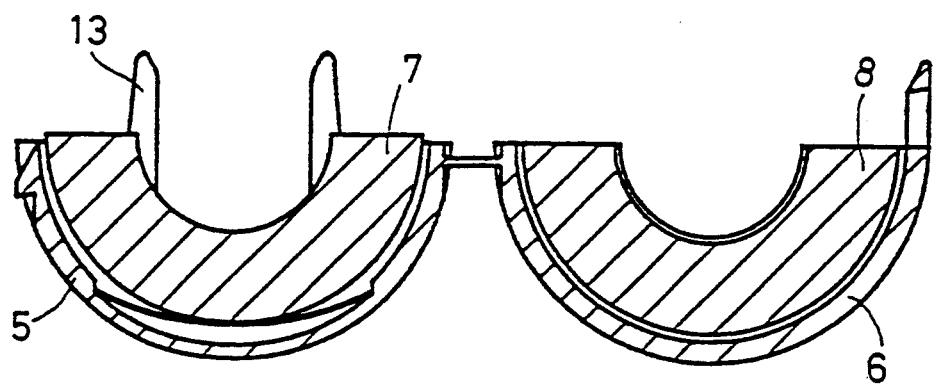
Figure 4D:
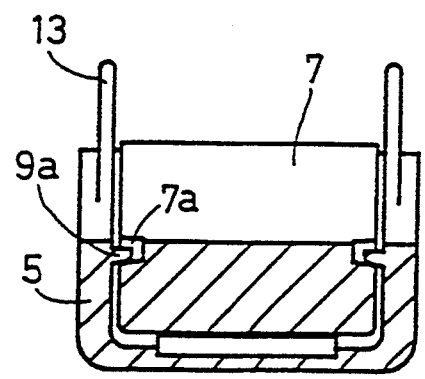

As shown in FIGS. 1-4, a noise absorber 1 in accordance with first embodiment is provided with a holding case 2 composed of first and second generally boat-shaped case members 5 and 6 connected to each other by a hinge 3. Separated ferrite parts 7 and 8 are embedded in the first and second case members 5 and 6 respectively. Half through holes 11 and 12 extend axially between opposed walls 9 and 10 of the first and second case members 5 and 6 respectively, to form a through hole 4 for passing electric wires therethrough. Projections 9a and 10a are formed on the inner surfaces of the walls 9 and 10 for engaging the ferrite parts 7 and 8, respectively.

Two pairs of wire supports 13 are formed on the inner surfaces of the opposed walls 9 of the first case member 5. The wire supports 13 are set upwardly at both sides of the half through hole 11 and are tilted toward the central axis of the half through hole 11. Thus, the wire supports 13 protrude from upper edges 11a of the half through hole 11. Further, the wire supports 13 are slightly resiliently deformable, such that electric wires 20 can be securely held between the wire supports 13. Channels 13a are formed on the inner surfaces of the opposed walls 9 and diametrically outside the lower parts of the wire supports 13 to allow the wire supports 13 to be resiliently bent.

Almost Y-shaped receptors 14 are formed on the inner surfaces of the opposed walls 10 of the second case member 6 to guide the tips of the wire supports 13 therein when the holding case 2 is closed. The upper tilting portions of the Y-shaped receptors 14 are defined by guide slopes 15 for pushing the tips of the wire supports 13 inwardly when the holding case 2 is closed.

A locking tab 17 having a rectangular aperture extends from the upper edge 16 of the hemi-cylindrical second case member 6. On the first case member 5, the upper edge 19 is provided with an engaging projection 18 for engaging in the locking tab 17 when the holding case 2 is closed.

The holding case 2 is integrally molded of synthetic resin. Among the components of the holding case 2, the wire supports 13, the locking tab 17 and the engaging projection 18 are given appropriate resilience.

The ferrite parts 7 and 8 are axially separated hemi-cylindrical bodies. Recesses 7a and 8a are formed in opposite axial ends of the ferrite parts 7 and 8 to engage with the projections 9a and 10a of the holding case 2 respectively. When the ferrite parts 7 and 8 are pushed in the direction of arrow A in FIG. 1, the projections 9a and 10a engage with the recesses 7a and 8a to securely hold the ferrite parts 7 and 8 in the case members 5 and 6. The noise absorber 1 is thus assembled.

Figure 5A:
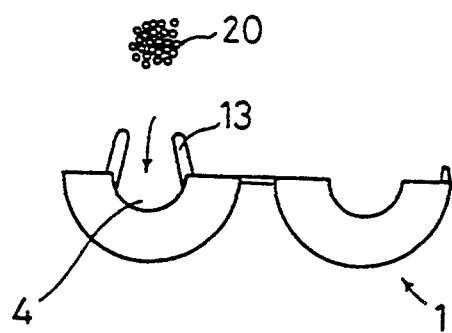
FIG. 5 is an explanatory view showing the application of the noise absorber of the first embodiment.
Figure 5B:
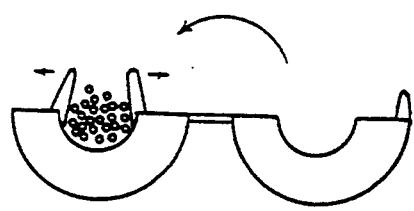
Figure 5C:
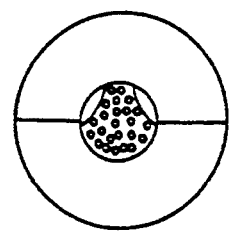
Figure 6:
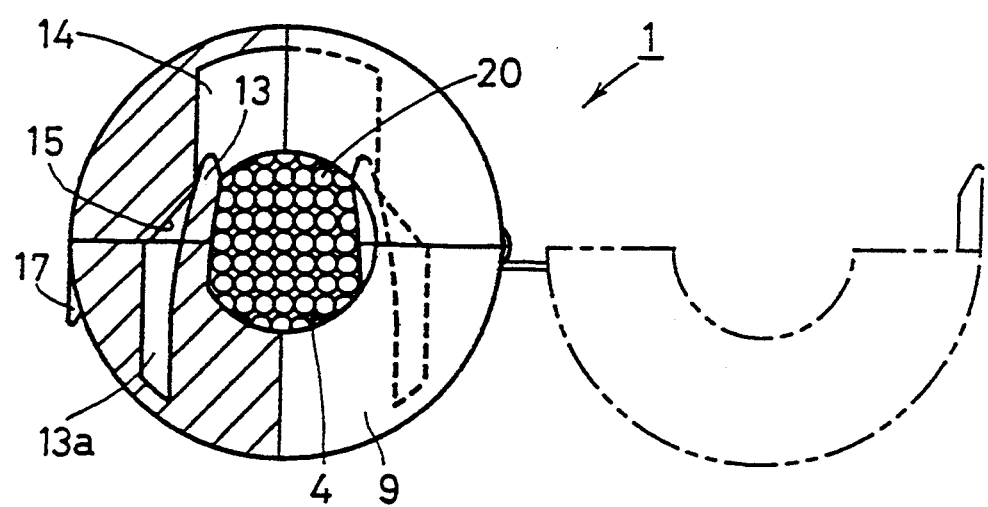
FIG. 6 is a partly broken cross-sectional view showing the securing of electric wires in the noise absorber of the first embodiment.

In order to attach the noise absorber 1 to the electric wires 20, as shown in FIG. 5A–5C, the noise absorber 1 is opened, then the pair of wire supports 13 are expanded slightly outwardly and electric wires 20 are packed in the wire-receiving through hole 4. The packed electric wires 20 slightly open the tips of the wire supports 13. Subsequently, when the noise absorber 1 is closed, as shown in FIG. 6, the tips of the pair of the wire supports 13 are pushed and bent inwardly by the guide slopes 15 of the receptor 14. When the engaging projection 18 is hooked in the locking tab 17, the noise absorber 1 is fixed around the electric wires 20 while holding the electric wires 20 in the through hole 4.

As aforementioned, in the first embodiment, by inserting the electric wires 20 between the pairs of wire supports 13 and closing the holding case 2, the inwardly pushed tips of the wire supports 13 firmly hold the electric wires 20 while the case members 5 and 6 are locked together. The noise absorber 1 is thus prevented from being dislocated or disengaged from its originally mounted position around the electric wires 20. The ferrite parts 7 and 8 can closely surround the periphery of the electric wires 20, thereby effectively absorbing and attenuating noise current which is entered through the electric wires 20 and is received or irradiated by the electric wires 20 serving as an antenna.

When the case members 5 and 6 are closed, the electric wires 20 are gathered around the central axis of the through hole 4 by the wire supports 13, and are never caught in the contact areas between the ferrite parts 7 and 8 housed in the case members 5 and 6. Therefore, the case members 5 and 6 can be easily closed without being hampered by the held electric wires 20. The noise absorber 1 can be thus easily attached to or detached from the electric wires 20.

Further, bundles of electric wires 20 that are slightly larger in diameter than the through hole 4 can be packed because the tips of the wire supports 13 are opened outwardly. In the first embodiment, the noise absorber 1 can be securely attached around electric wires 20 that vary in diameter.

The noise absorber 1 is relocated or detached by simply pulling out the locking tab 17 of the second case member 6. In this way the locking tab 17 is easily unlocked from the engaging projection 18, thereby opening the case members 5 and 6. The noise absorber 1 can thus be easily replaced or detached.

Although the noise absorber 1 is applied to the bundle of electric wires 20 in the first embodiment, the noise absorber 1 can be applied to a single electric wire 20.

Further modifications and embodiments explained later have the same advantages as those of the above-explained first embodiment, although they have some different structural features from those of the first embodiment.

Figure 7A:
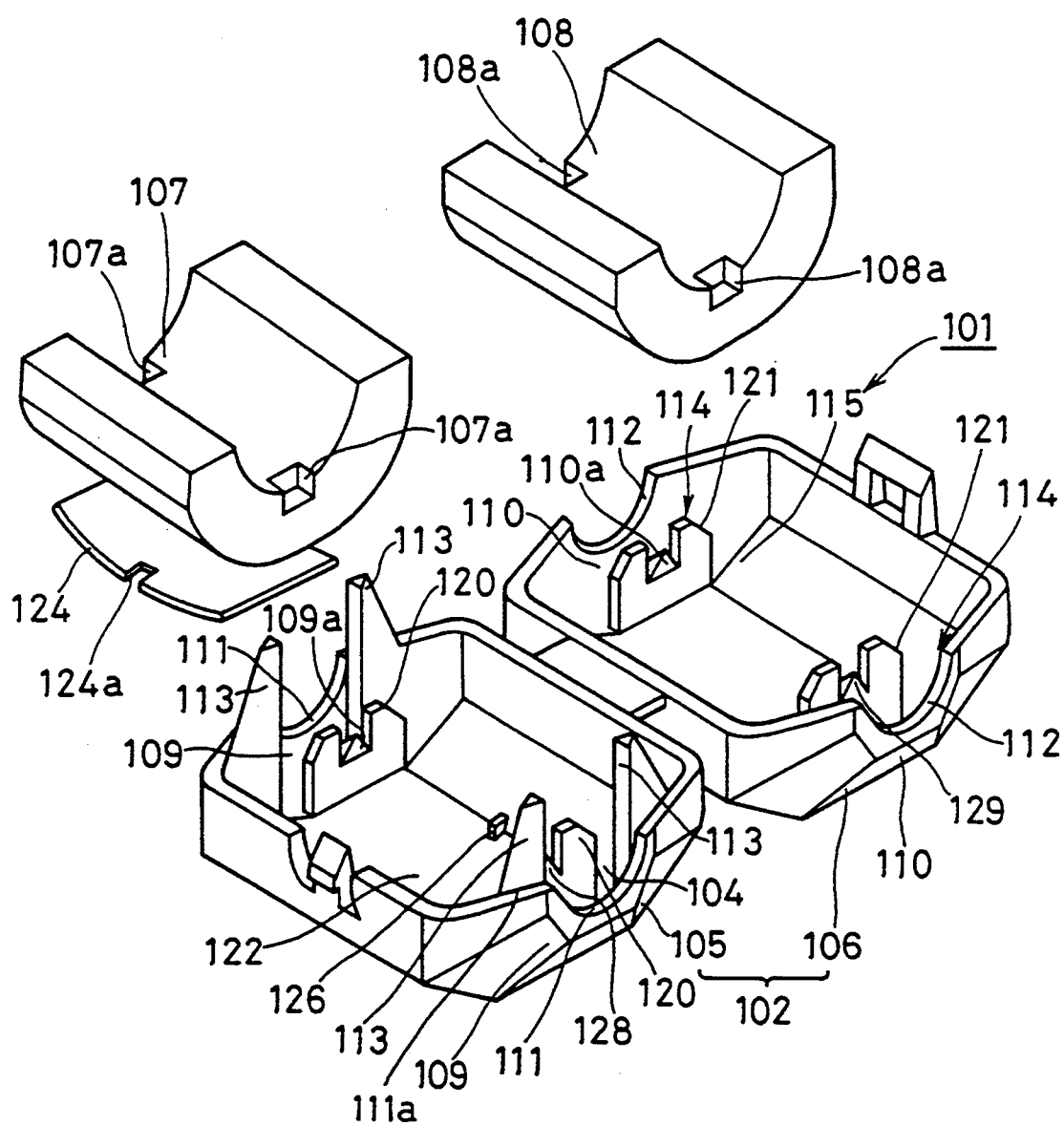
FIG. 7A is an exploded view of a modification of the noise absorber of the first embodiment forming a second embodiment.
Figure 7B:
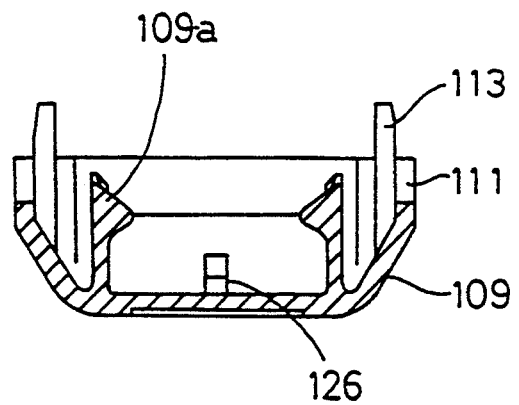
FIG. 7B is a cross-sectional view of the first case member of the noise absorber of the second embodiment.

A second embodiment of the noise absorber 1 is now explained referring to FIGS. 7A and 7B. In this modification, a noise absorber 101 is provided with a holding case 102 similar to the holding case 2 shown in FIG. 1. The holding case 102 has an octagonal cross section. The holding case 102 is composed of generally boat-shaped first and second case members 105 and 106 hingedly connected to each other. The upper portions of the case members 105 and 106 are longitudinally elongated. Half through holes 111 and 112 extend between axially opposed walls 109 and 110 respectively, to form a through hole 104 for passing electric wires therethrough.

Inside the opposed walls 109 of the first case member 105 vertical plates 120 are erected and, as shown in FIG. 7B, have projections 109a for locking on a ferrite part 107. Also inside the opposed walls 109 of the first case member 105 two pairs of wire supports 113 are erected at both sides of the half through hole 111. The wire supports 113 protrude from upper edges 111a of the half through hole 111.

Inside the opposed walls 110 of the second case member 106, vertical plates 121 are erected and have projections 110a for locking on a ferrite part 108. The projections 110a are structurally identical to the projections 109a. Between the opposed walls 110 and the vertical plates 121 receptors 114 are formed to receive the wire supports 113 when the holding case 102 is closed. Both lower ends of the receptors 114 are defined by slopes 115. The slopes 115 are formed by the sloping inner walls of the second case member 106.

The ferrite parts 107 and 108 have recesses 107a and 108a for engaging with the projections 109a and 110a of the case members 105 and 106 respectively. A leaf spring 124 is inserted between the ferrite part 107 and the bottom face 122 of case member 105, such that the electric wires are secured between the ferrite parts 107 and 108 when the holding case 102 is closed. The leaf spring 124 has side notches 124a for fixing the leaf spring 124 in the case member 105. The case member 105 has projections 126 for engaging in the side notches 124a of the leaf spring 124.

Teeth 128 and 129 are formed on the upper ends of the vertical plates 120 and 121 of the case members 105 and 106 respectively.

In the noise absorber 101 having the aforementioned structure, the electric wires held in the through hole 104 can be firmly secured by the teeth 128 and 129 in the holding case 102. The wire supports 113 can be formed of resilient material, and the slopes 115 can be provided with portions for resiliently bending the tips of the wire supports 113.

Figure 8:
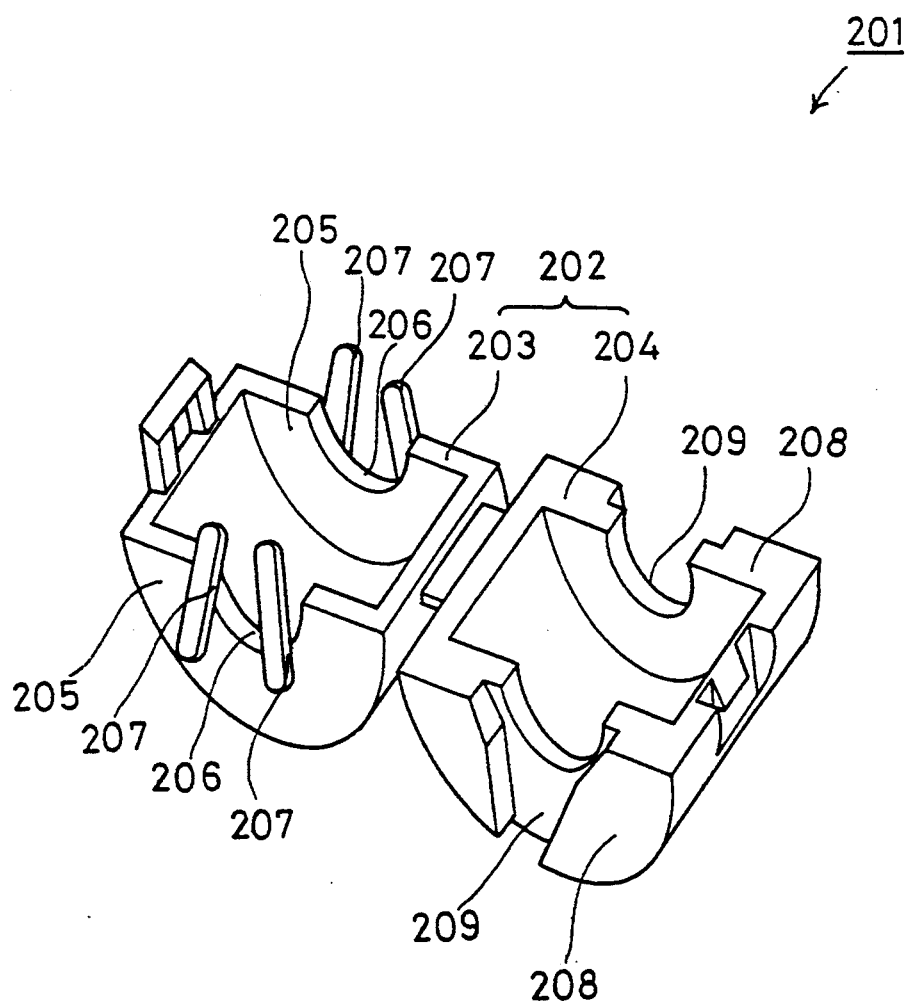
FIG. 8 is a perspective view showing a noise absorber of a third embodiment.

A third embodiment is now explained referring to FIG. 8. In the third embodiment, a noise absorber 201 is provided with an openable and closable holding case 202 almost identical to the holding case 2 of the first embodiment. The holding case 202 is composed of first and second generally boat-shaped case members 203 and 204 hingedly connected to each other. In the first case member 203 resilient wire supports 207 are erected at both sides of a half through hole 206. Two pairs of the wire supports 207 are formed on the outer surfaces of axially opposed walls 205 respectively. In the second case member 204 receptors 209 are formed on the outer surfaces of opposed walls 208 respectively, to receive the wire supports 207 when the holding case 202 is closed. The receptors 209 are narrowed toward their lower parts such that the tips of the received wire supports 207 are pushed and bent inwardly when the case is closed.

As aforementioned, since the wire supports 207 are formed outside the holding case 202, the holding case 202 holding the electric wires 20 therein can be easily closed.

Figure 9:
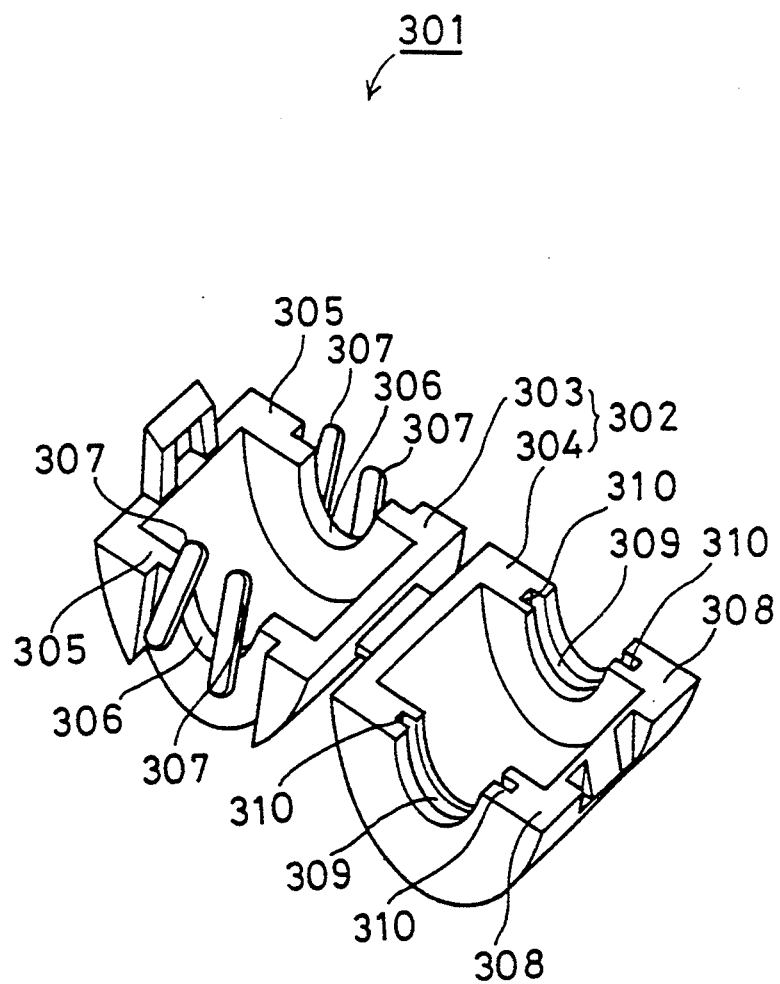
FIG. 9 is a perspective view showing a noise absorber of a fourth embodiment.

A fourth embodiment is now explained referring to FIG. 9. In the fourth embodiment a noise absorber 301 is provided with an openable and closable holding case 302 almost identical to the holding case 202 of the third embodiment. The holding case 302 is composed of first and second generally boat-shaped case members 303 and 304 hingedly connected to each other. In the first case member 303 resilient wire supports 307 are erected at both sides of a half through hole 306. Two pairs of the wire supports 307 are formed on the outer surfaces of axially opposed walls 305 respectively. In the second case member 304 receptors 309 are formed inside opposed walls 308 respectively, to receive the wire supports 307 when the holding case 302 is closed. The upper portions of the receptors 309 are formed by guide grooves 310 for bending inwardly the tips of the received wire supports 307.

As aforementioned, the tips of the wire supports 307 are firmly inserted in the receptors 309. Therefore, the electric wires 20 can be securely held in the noise absorber 301.

Figure 10:
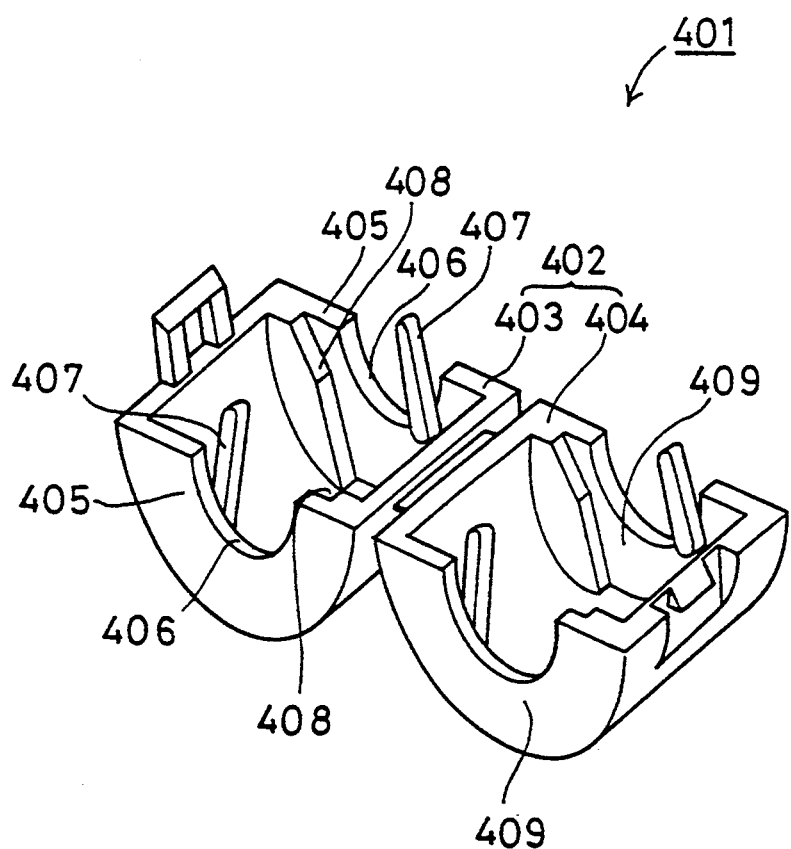
FIG. 10 is a perspective view showing a noise absorber of a fifth embodiment.

A fifth embodiment is now explained referring to FIG. 10. In the fifth embodiment a noise absorber 401 is provided with an openable and closable holding case 402 almost identical to the holding case 302 of the fourth embodiment. The holding case 402 is composed of first and second generally boat-shaped case members 403 and 404 hingedly connected to each other. On each of the inner surfaces of opposed walls 405 of the first case member 403, a wire support 407 is erected at one side of a half through hole 406 and a guide slope 408 is formed on the other side of the half through hole 406. The upper portions of guide slopes 408 are bent outwardly to open wider. This arrangement is different from the aforementioned embodiments in which a pair of wire supports are erected at both sides of the half through hole.

In the same way as in the first case member 403, on each of the inner surfaces of opposed walls 409 of the second case member 404, a pair of wire supports 407 and guide slopes 408 are formed. The wire supports 407 and the guide slopes 408 are arranged such that the wire supports 407 of the case member 403 or 404 are engaged with the guide slopes 408 of the other case member when the holding case 402 is closed.

Figure 11:
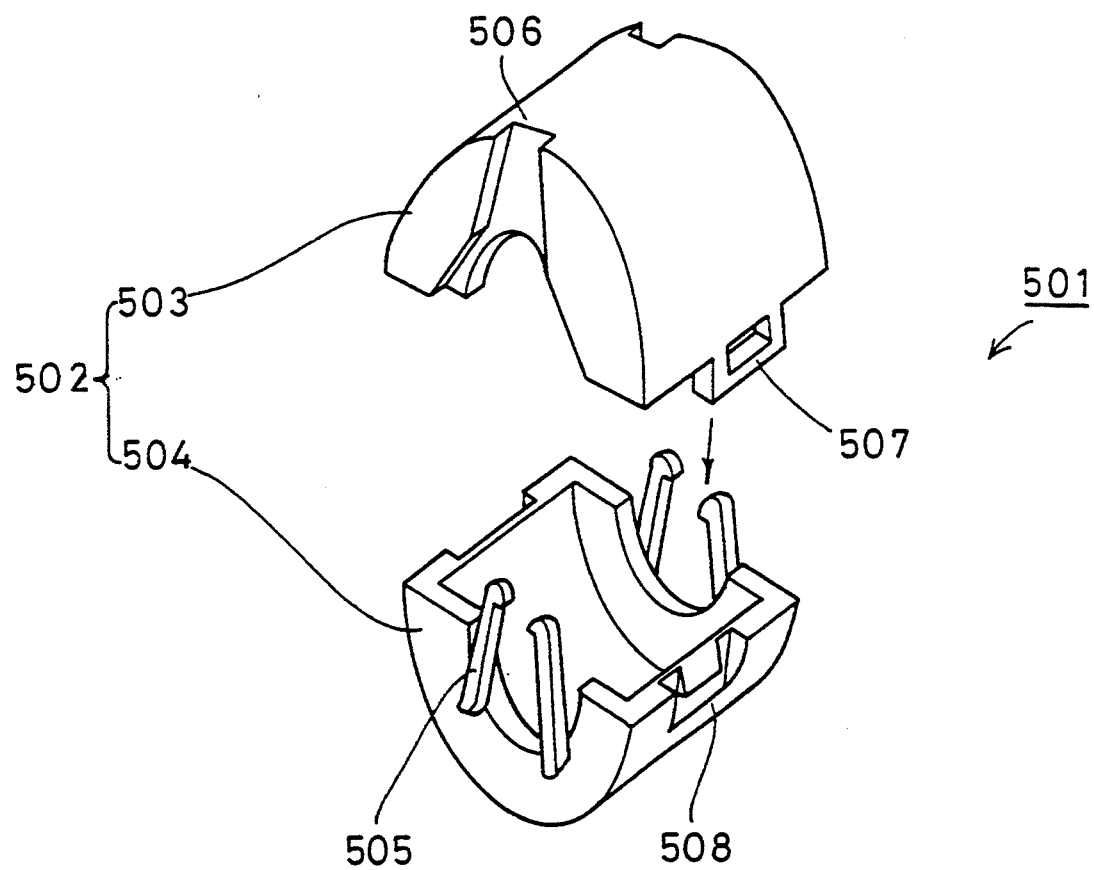
FIG. 11 is a perspective view showing a noise absorber of a sixth embodiment.

A sixth embodiment is now explained referring to FIG. 11. Different from the aforementioned embodiments, in the sixth embodiment, a holding case 502 is composed of separated generally boat-shaped first and second case members 503 and 504. Wire supports 505 and receptors 506 have almost the same structural features as those of the wire supports 207 and the receptors 209 of the third embodiment. However, locking tabs 507 and engaging projections 508 are provided on both sides of the case members 503 and 504 respectively, to assemble the case members 503 and 504 and thus close the holding case 502.

Since the case members 503 and 504 are separate, the position of the electric wires 20 can be confirmed when the holding case 502 is closed, and the noise absorber 501 can be easily manufactured.

The invention has been described above with reference to preferred embodiments shown in the drawings. Modifications and alterations may become apparent to one skilled in the art upon reading and understanding the specification. Despite the use of the embodiments for illustration purposes, it is intended to include all such modifications and alterations within the scope and the spirit of the appended claims.

In this spirit, it should also be noted that the ferrite parts 7 and 8 can be formed of either hard or soft ferrite. The ferrite parts 7 and 8 can be replaced with the plastic or rubber magnets molded by blending magnetic powder with plastic or synthetic rubber. Permalloy, thermalloy or other magnetic parts can also be used.

The ferrite parts 7 and 8, which are housed in the case member serving as an insulating member, can be replaced with silicon steel or other conductive parts.

Additionally, the wire support members can prevent the case members from deviating from their closed position due to unexpected external force when the noise absorber is used. If the case members having no wire support members are not completely closed during the use of the noise absorber, the noise absorber might be unlocked from the electrical wire, and %he magnetic bodies might be dislocated from the case members, thereby impairing the noise attenuating effect of the noise absorber. In the invention, however, the wire support prevents such problem from arising.

What is claimed is:

1. An electric noise absorber comprising:
a pair of magnetic bodies for surrounding an outer periphery of at least one electric wire to absorb noise current flowing through the electric wire;
a hollow openable and closable holding case formed by a first and a second hollow case member, both said first and second hollow case members being open on one side for holding one of said pair of magnetic bodies therein, the open sides of said case members being joinable together to form a closed holding case with said pair of magnetic bodies being accommodated therein, and half through holes being formed in opposite ends of said case members, adjacent the open side, such that the half through holes form a through hole extending through the holding case, when the case members are joined together, for holding the electric wire therein;

at least one wire support member extending from an end portion of said first case member, said support member directly abutting and being resiliently deformed by an opposed surface of said second case member when the case members are joined together; and an indentation being formed in said second case member for receiving said wire support member when the holding case is closed by joining said two case members;

wherein, upon joining said case members together, said wire support member is biased by said indentation against a said wire accommodated within the through hole and secures said noise absorber in place at a desired location along that said wire.

2. An electric noise absorber as in claim 1, wherein said wire support member extends outwardly from said first case member adjacent said half through hole and extends into said second case member when the case members are joined together.

3. An electric noise absorber comprising:

a pair of magnetic bodies for surrounding an outer periphery of at least one electric wire to absorb noise current flowing through the electric wire;

a hollow openable and closable holding case formed by a first and a second hollow case member, both said first and second hollow case members being open on one side for holding one of said pair of magnetic bodies therein, the open sides of said case members being joinable together to form a closed holding case with said pair of magnetic bodies being accommodated therein, and half through holes being formed in opposite ends of said case members, adjacent the open side, such that the half through holes form a through hole extending through the holding case, when the case members are joined together, for holding the electric wire therein;

at least one resilient wire support member extending outwardly from said first case member adjacent said half through hole and said wire support member being positionable within and directly engaging with said second case member when said two case members are joined together with one another; and a guide surface being formed in said second case member for directly biasing said wire support member towards a central axis of said through hole when the holding case is closed by joining the two case members together such that said wire support member is forced against a said wire accommodated within the through hole thereby securing the noise absorber in place at a desired location along a said wire.

4. An electric noise absorber as in claim 3, wherein two pairs of resilient wire support members extend outwardly from said first case member and are extendible into said second case member, one pair of said resilient wire support members is located adjacent one end of said first case member and the other pair is located adjacent the opposite end of said first case member, and one wire support member of each pair is located adjacent to one side of its respective half through hole and the other wire support member of each pair is located adjacent to the opposite side of its respective half through hole, and guide surfaces are formed in each end of said second case member for biasing said wire support members toward a central axis of the through hole when the case is closed, by joining the two case members together, such that said wire support members press against opposite sides of a said wire thereby pinching a said wire therebetween and holding said noise absorber securely in place at the desired location along a said wire.

5. An electric noise absorber as in claim 4, wherein said guide surfaces comprise a pair of generally Y-shaped receptors formed in opposite ends of said second case member.

6. An electric noise absorber as in claim 5, wherein said Y-shaped receptors are on the outside of each longitudinal end of the second case member.

7. An electric noise absorber as in claim 5, wherein said Y-shaped receptors are on the inside of each longitudinal end of said second case member.

8. An electric noise absorber as in claim 4, wherein said resilient wire supports have small hooks adjacent their ends.

9. An electric noise absorber as in claim 4, wherein said guide surfaces comprise a pair of V-shaped grooves with one of said V-shaped grooves being formed in each end wall of said second case member.

10. An electric noise absorber as in claim 3, wherein one of said resilient wire support member extends from one end wall of said first case member, adjacent the half through hole, and is engageable with said second case member, a second resilient wire support member extends from the other end of said first case member, adjacent the half through hole, and is engageable with said second member, and a guide surface is provided in each end of said second case member to bias the resilient wire support members towards a central axis of said through hole upon closing said case member.

11. An electric noise absorber as in claim 1, wherein said first and second case members are connected by a hinge.

12. An electric noise absorber as in claim 11, wherein a locking tab extends from an edge of said first case member from a side of said case member opposite said hinge and an aperture is provided in said locking tab, and a projection is formed on a surface of said second member, opposite said hinge, for engaging with said aperture in said locking tab and locking said case members with one another with at least one wire located therebetween.

13. An electric noise absorber as in claim 1, wherein said electric noise absorber is used in combination with a plurality of wires.

* * * * *